United States Patent
Tanzawa et al.

(10) Patent No.: US 6,816,421 B2
(45) Date of Patent: Nov. 9, 2004

(54) NONVOLATILE SEMICONDUCTOR MEMORY

(75) Inventors: Toru Tanzawa, Tokyo (JP); Akira Umezawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 213 days.

(21) Appl. No.: 10/291,700

(22) Filed: Nov. 12, 2002

(65) Prior Publication Data
US 2004/0047202 A1 Mar. 11, 2004

(30) Foreign Application Priority Data

Sep. 11, 2002 (JP) ........................................ 2002-265773

(51) Int. Cl.[7] ................................................ G11C 7/00
(52) U.S. Cl. .................. 365/201; 365/202; 365/189.08; 365/185.25
(58) Field of Search ........................... 365/201, 189.08, 365/185.25, 202

(56) References Cited

U.S. PATENT DOCUMENTS 5,768,215 A * 6/1998 Kwon et al. ............. 365/238.5
5,835,956 A * 11/1998 Park et al. .................. 711/167

OTHER PUBLICATIONS

B. Pathak, et al. "A 1.8V 64Mb 100MHz Flexible Read While Write Flash Memory," ISSCC Digest of Technical Papers, Session 2, Feb. 2001, pp. 32–33.

T. Tanzawa, et al. "A 44mm[2] 4–Bank 8–word Page Read 64Mb Flash Memory with Flexible Block Redundancy and Fast Accurate Word–Line Voltage Controller," ISSCC Digest of Technical Papers, Session 6, Feb. 4, 2002, pp. 102–103.

* cited by examiner

*Primary Examiner*—Connie C. Yoha
(74) *Attorney, Agent, or Firm*—Oblon, Spivak, McClelland, Maier & Neustadt, P.C.

(57) ABSTRACT

A nonvolatile semiconductor memory is disclosed, which comprises first and second nonvolatile memory cells, first and second bit lines, first and second column selection transistors, a first column resetting and bit line testing transistor connected to a first node to which the first and second column selection transistors are connected, a sense amplifier which amplifies a cell data on the first node, and a control circuit which controls to turn the resetting and testing transistor on to reset a potential of the first node, after data the first or second memory cell selected by turning the first or second column selection transistor on has been sensed by the sense amplifier in a first time duration, and controls to electrically separate the sense amplifier from the first node while the first and second column selection transistors and the resetting and testing transistor are turned on simultaneously in a second time duration.

23 Claims, 13 Drawing Sheets

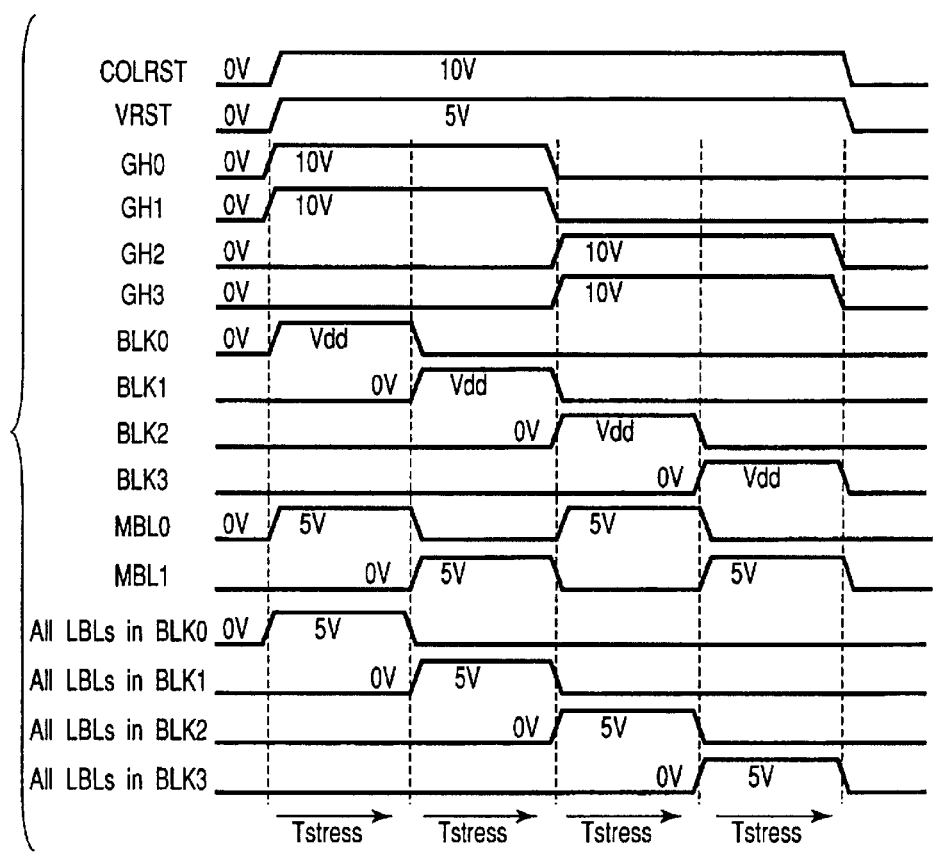
F I G. 5

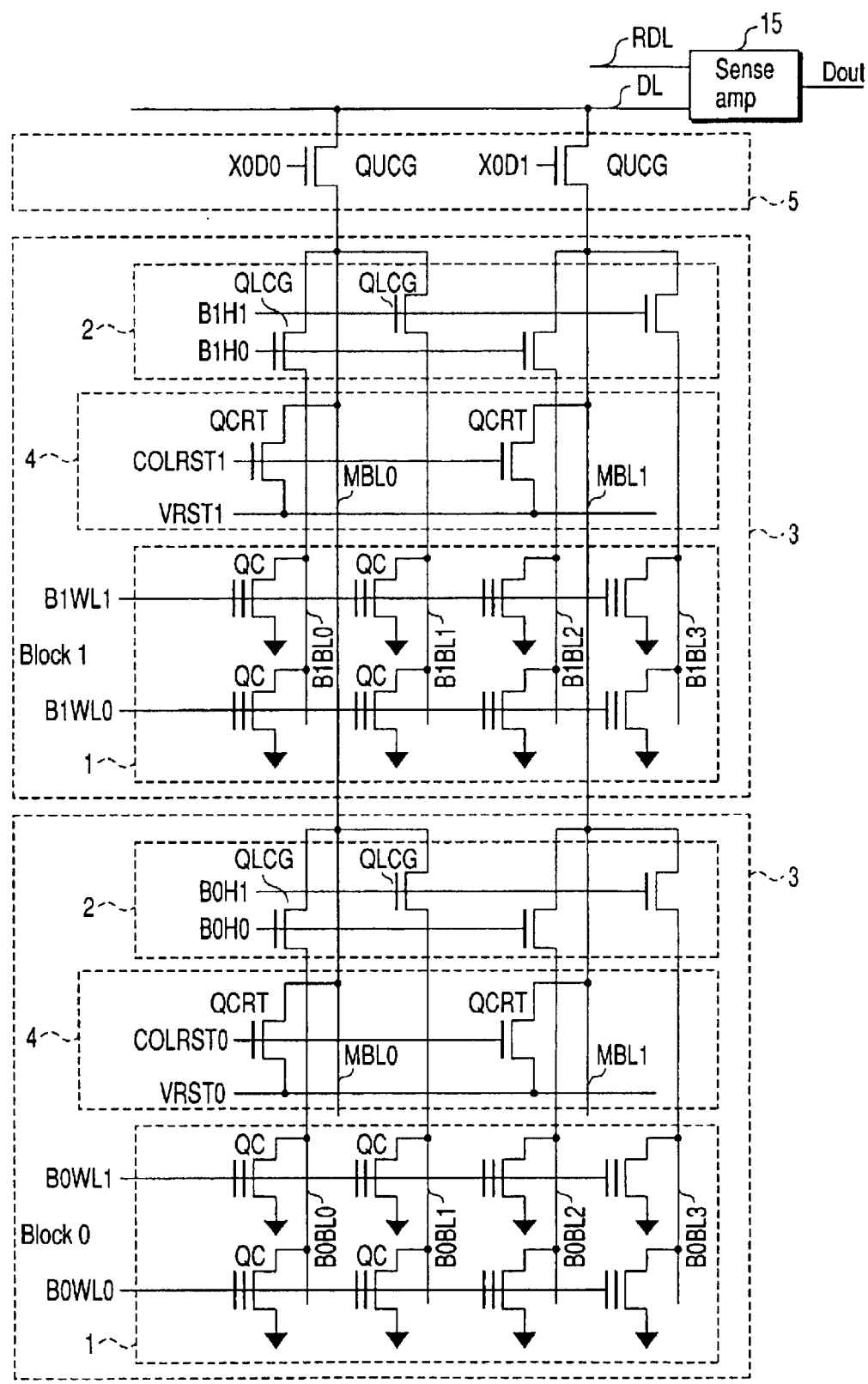
F I G. 12

NONVOLATILE SEMICONDUCTOR MEMORY

CROSS-REFERENCE TO RELATED APPLICATIONS

This application is based upon and claims the benefit of priority from the prior Japanese Patent Application No. 2002-265773, filed Sep. 11, 2002, the entire contents of which are incorporated herein by reference.

BACKGROUND OF THE INVENTION

1. Field of the Invention

The present invention relates to a nonvolatile semiconductor memory, particularly relates to a semiconductor memory having a hierarchical bit line structure, for example, a semiconductor memory for use in a NOR type flash memory.

2. Description of the Related Art

There is a NOR type flash memory as one of the nonvolatile semiconductor memories.

FIG. 9 is an equivalent circuit diagram showing a part of a memory cell array in the NOR type flash memory.

Memory cell transistors (hereinafter referred to as "cell transistor") are arrayed in a matrix form on a semiconductor substrate, control gates of the cell transistors are connected to corresponding word lines WL0 to WLn. Bit lines BL0 to BLm are provided on a CVD oxide film of the semiconductor substrate where the cell transistors are formed. Drains of the cell transistor are connected to corresponding bit lines BL0 to BLm.

FIG. 10 shows a sectional view of the cell transistor in FIG. 9. The cell transistor has a MOSFET structure in which a floating gate is formed on the semiconductor substrate through a tunnel oxide film and the control gate is formed on the floating gate through an inter-gate insulating film. A threshold voltage of the cell transistor is varied by the number of electrons stored in the floating gate.

FIG. 11 shows a relationship between a control gate voltage and a drain current of the cell transistor shown in FIG. 10.

A state in which the relatively many electrons are stored in the floating gate and the threshold voltage Vt of the cell transistor is high is defined as "0" data. On the contrary, a state in which the relatively few electrons are stored in the floating gate and the threshold voltage Vt is low is defined as "1" data.

Voltage applied to the control gate of the cell transistor (word line voltage) is varied by operating modes. Table 1 shows an example of bias conditions of data read, data write, and data erase for the cell transistor. Where Vg is a control gate voltage, Vd is a drain voltage, and Vs is a source voltage.

TABLE 1

|    | (Read) | (Program)         | (Erase)  |
|----|--------|-------------------|----------|
| Vg | 5 V    | 9 V               | −7 V     |
| Vd | 1 V    | 5 V("0"), 0 V("1")| Floating |
| Vs | 0 V    | 0 V               | 10 V     |

As shown in Table 1, in case of the read of data, a voltage of 0V is applied to the source, a voltage of 1V is applied to the drain (bit line connected to cell transistor), a read voltage of 5V is applied to the control gate to determine whether or not a predetermined cell current is flown.

The write of data is carried out for every bit. In the write of data, the voltage of 0V is applied to the source and the voltage of 9V is applied to the control gate. In case that the "0" data is written, the voltage of 5V is applied to the drain so that the high energy electron generated by a channel hot electron phenomenon is injected to the floating gate, which causes the threshold voltage Vt to be changed. When the "1" data is held, the voltage of 0V is applied to the drain so that the injection of the electron to the floating gate is not occurred, and thus the change in the threshold voltage Vt is not occurred.

The erase of data is carried out collectively to the plurality of cell transistor having the source and the P-well in common. In the erase of data, the voltage of 10V is applied to the source, an erase voltage of −7V is applied to the floating gate, and the drain is set to be a floating state. As a result, the electron is flown from the floating gate to the substrate by an F-N tunnel phenomenon, all the target cell transistors for erasing are set to be the "1" data.

In order to confirm the write and the erase of data to the cell transistors, write verify and erase verify are carried out.

In the write verify, the read of "0" is carried out in a manner that the higher voltage Vpv compared with the voltage in reading is applied to the control gate of the cell transistor. The write and the write verify are carried one after the other, and then the write operation is ended when all the target cell transistors for writing are set to be "0".

In the erase verify, the read of "1" is carried out in a manner that the lower voltage Vev compared with the voltage in reading is applied to the control gate of the cell transistor. The erase and the erase verify are carried one after the other, and then the erase operation is ended when a cell current Icell of the target cell transistor for erasing is secured sufficiently (when all the target cell transistors for erasing are set to be "1").

FIG. 12 shows a part of the conventional NOR type flash memory in which a memory core portion has the hierarchical bit line structure.

In FIG. 12, reference numeral 1 is a cell transistor area, 2 is a lower column gate area, 3 is a cell block, 4 is a column reset transistor area, and 5 is an upper column gate area.

That is to say, the memory cell array having cell transistor QC arrayed in a matrix form is divided into the plurality of cell blocks 3 in a longitudinal direction (i.e. column direction) of the upper bit lines MBL0, MBL1, . . . . The upper bit lines MBL0, MBL1, . . . are common for the plurality of cell blocks 3a.

Operation such as the read and the write is carried out while selecting one of the plurality of cell blocks 3.

In each cell block 3, a plurality of lower bit lines BiBL0, BiBL1, BiBL2, BiBL3, . . . (i=0, 1, . . . ) are provided to extend in the column direction of the memory cell array. Drains of a plurality of cell transistors QC are connected to a corresponding one of the lower bit lines BiBL0, BiBL1, BiBL2, BiBL3, . . . . Also in each cell block 3, a plurality of word lines BiWL0, BiWL1, BiBL2, . . . (i=0, 1, . . . ) are provided to extend in a row direction of the memory cell array. Control gates of a plurality of cell transistors QC are connected to a corresponding one of the word lines BiWL0, BiWL1, BiBL2, . . . . Adjacent two lower bit lines (BiBL0, BiBL1), (BiBL2, BiBL3), . . . of the lower bit lines BiBL0, BiBL1, BiBL2, BiBL3, . . . form one pair. The adjacent two lower bit lines (BiBL0, BiBL1), (BiBL2, BiBL3), . . . are commonly connected to a corresponding one of the upper bit lines MLB0, MLB1, . . . through respective column selection transistors (lower column gates) QLCG. Each of the column selection transistors QLCG is controlled by a signal of a corresponding one of column selection lines BiH0, BiH1, . . . (i=0, 1, . . . ). The lower bit lines BiBL0, BiBL1, BiBL2, BiBL3, . . . comprise metal wirings of a first-stage layer and the upper bit lines MBL0, MBL1, . . . comprise metal wirings of a second-stage layer.

In each cell block 3, a drain of a column reset transistor QCRT is connected to upper bit lines MBL0, MBL1, . . . . In the column reset transistor QCRT, a source of the column reset transistor QCRT is connected to a reset voltage line VRSTi (i=0, 1, . . . ), and a gate of the column reset transistor QCRT is connected to a column reset line COLRSTi (i=0, 1, . . . ).

Each of the upper bit lines MBL0, MBL1, . . . is connected to a data line DL and a sense amplifier 15 through a corresponding one of upper bit line selection transistors (upper column gates) QUCG. Upper column selection lines XiD0, XiD1, . . . (i=0, 1, . . . ) are connected to the gates of the respective upper bit line selection transistors QUCG.

As described later, the column reset transistor QCRT functions to reset charges of bit lines after read operation and also apply a stress voltage to the drain of the cell transistor through bit lines in the drain stress test (bit line test), so that the column reset transistor QCRT is a column-resetting and bit line testing transistor.

FIG. 15 is an example of a circuit diagram of a sense amplifier of the memory shown in FIG. 12;

As shown in FIG. 15, the sense amplifier compares a reference current Iref of a reference cell flowing through the reference data line RDL and a cell current Iload of a memory cell flowing through the cell data line DL and outputs data Dout of the memory cell in accordance with the comparison result.

FIG. 13A shows an example of an operating waveform in case of the read operation in the memory core shown in FIG. 12.

When, for example, the word line B0WL0 is selected and the column line B0H0 is activated ("H" level) to select a lower column gate QLCG, a corresponding cell transistor in the cell block 3 of a block number 0 is selected. A voltage dependent on data of the selected cell transistor is appeared on the upper bit line MBL0 through the lower bit line B0BL0. At this time, in case that a column gate selection line X0D0 is the "H" level and thus the upper bit line MBL0 is electrically connected to a data line DL, the sense amplifier 15 senses and amplifies a voltage of the data line DL and outputs a cell data in accordance with the comparison result.

When the read operation is ended, the column reset signal line COLRST0 corresponding to the selected cell block 3 of block number 0 is activated ("H" level) while the selected lower column gate QLCG is kept activated, so that the charge of the upper bit line MBL0 is discharged through the column resetting transistor QCRT. Since at this time the column reset voltage line VRST0 of the source of the column reset transistor QCRT is set at 0V, an electric potential of the upper bit line MBL0 is reset to 0V.

FIG. 13C is an example of a circuit diagram for generating the bit line reset signal COLRST0. The signal generating circuit comprises an inverter and a NOR circuit. The inverter receives an address transition detection signal ATD and inverts the logic level of the address transition detection signal ATD. The NOR circuit receives the inverted signal output from the inverter and block address inputs BLKADD 0 and BLKADD 1 and generates the bit line reset signal COLRST0.

Transition of internal address signals such as the block address signals BLKADD 0 and BLKADD 1 are completed during the "H" level time period.

The bit line reset signal COLRST0 is at the "H" level until time T1, as the target cell block, i.e. the cell block to be selected by the block selection signal BLK0 is at the non-selected state. Hence, the bit lines in the target cell block are connected to ground. The target cell block is put into a selected state during the time period from time T1 to time T2, while the bit line reset signal COLRST0 goes to the "L" level. Thus, reading of data from the memory cells are carried out. After time T2, the target cell block is again set at a non-selected state and the bit line reset signal COLRST0 goes to the "H" level, and thus all of the bit lines in the target cell block are connected to ground.

FIG. 13B shows an example of an operating waveform in case of a drain stress test (bit line test) in the memory core shown in FIG. 12.

In a state that a stress voltage is applied to the drains of the cell transistors while these cell transistors are set at "0" data, the threshold voltage after the test of those of the cell transistors which have a defect in the drain side tunnel oxide film portion is lowered. A yield can be increased by performing a redundancy relief for the defective cell transistors.

In the example, in a state that all of the cell transistors in the one or plurality of cell blocks 3 as a target of the test are set at "0" data beforehand, the lower column gates QLCG in the selected cell block 3 are turned on and all the upper column gates QUCG are turned off. In this time, the column reset voltage line VRST is set at, for example, a voltage of 5V in writing, the voltage of 5V is applied simultaneously as the stress voltage from the source of the column reset transistor QCRT to the drains of all of the cell transistors in the selected cell block 3 so that a test time is shortened.

Since a gate width of the column reset transistor QCRT is sufficiently small, even though there is a defective leak column in the selected cell block 3, electric potential of other bit lines is not almost affected by the defective leak column.

By the way, a size of transistors has been reduced with developing a micro processing technology. However, scaling of the peripheral transistors such as the column rest transistors QCRT becomes difficult because a thickness of the tunnel oxide films of the cell transistors is not scaled down in order to secure the reliability.

For example, FIG. 14 shows before-scaling and after-scaling arrangements of cell transistors in a cell array area (Cell array) and column reset transistors in a column reset transistor area (Reset transistor).

In the arrangement after scaling, even though the cell transistors in the cell array area are arranged a bit line pitch, the column reset transistors in the column reset transistor area can not be arranged by the bit line pitch. For this reason, a length L of the column reset transistor area is increased, which results in difficulty of higher integration of the semiconductor memory.

In FIG. 14, "Active area" is an active area in the semiconductor substrate (drain, source, and channel regions of a MOSFET). "Gate" is a gate electrode of the MOSFET. "Conductor wiring" is a conductor wiring which connects the column selecting cell transistors in the cell array area to the reset transistors in the column reset transistor area.

As described above, there is a disadvantage in the conventional nonvolatile semiconductor memory, that is to say, when scaling of the peripheral transistors such as the column rest transistors become difficult and the column reset transistors can not be arranged by the bit line pitch, then the column reset transistors area becomes large, which results in the difficulty of the higher integration.

BRIEF SUMMARY OF THE INVENTION

According to an aspect of the present invention, there is provided a nonvolatile semiconductor memory comprising a first nonvolatile memory cell and a second nonvolatile memory cell, each of the nonvolatile memory cells holding data; first and second bit lines which are connected correspondingly to the first and second nonvolatile memory cells; first and second column selection transistors connected correspondingly to the first and second bit lines; a first column resetting and bit line testing transistor a drain of which is connected to a first node to which the first and second column selection transistors are commonly connected; a sense amplifier which is selectively connected to the first node and senses and amplifies a cell data appeared on the first node; and a control circuit which controls to turn the first column resetting and bit line testing transistor on to reset an electric potential of the first node, after data of one of the first and second nonvolatile memory cells selected by turning one of the first and second column selection transistors on has been sensed by the sense amplifier in a first time duration, and controls to electrically separate the sense amplifier from the first node while the first and second column selection transistors and the first column resetting and bit line testing transistor are turned on simultaneously in a second time duration.

According to another aspect of the present invention, there is provided a nonvolatile semiconductor memory comprising a first nonvolatile memory cell and a second nonvolatile memory cell a source of each of which is connected to a first common node, each of the first and second nonvolatile memory cells holding data; a third nonvolatile memory cell and a fourth nonvolatile memory cell a source of each of which is connected to a second common node, each of the third and fourth nonvolatile memory cells holding data; first to fourth lower bit lines which are connected correspondingly to the first to fourth nonvolatile memory cells; first to fourth lower column selection transistors one ends of which are connected correspondingly to the first to fourth lower bit lines; a first upper bit line which is connected in common to the other end of each of the first and second lower column selection transistors; a second upper bit line which is connected in common to the other end of each of the third and fourth lower column selection transistors; first and second column resetting and bit line testing transistors, drains of the first and second column resetting and bit line testing transistors being connected corresponding to the first and second upper bit lines; a sense amplifier which is connected selectively to one of the first and second upper bit lines and senses and amplifies a cell data appeared on one of the first and second upper bit lines; and a control circuit which controls to turn one of the first and the second column resetting and bit line testing transistors on to reset an electric potential of one of the first and the second upper bit lines, after data of at least one of the first to fourth nonvolatile memory cells selected by turning at least one of the first to fourth lower column selection transistors on has been sensed by the sense amplifier in an operation time of reading cell data, and controls to electrically separate the sense amplifier from the first and second upper bit lines while the first to fourth lower column selection transistors and the first and second column resetting and bit line testing transistors are turned on simultaneously in a bit line test time.

According to a further of the present invention, there is provided a nonvolatile semiconductor memory comprising a first nonvolatile memory cell and a second nonvolatile memory cell a source of each of which is connected to a first common node, each of the first and second nonvolatile memory cells holding data; a third nonvolatile memory cell and a fourth nonvolatile memory cell a source of each of which is connected to a second common node, each of the third and fourth nonvolatile memory cells holding data; first to fourth lower bit lines which are connected correspondingly to the first to fourth nonvolatile memory cells; first to fourth lower column selection transistors one ends of which are connected correspondingly to the first to fourth lower bit lines; a first upper bit line which is connected to the other ends of the first to fourth lower column selection transistors; first column resetting and bit line testing transistor, a drain of the first column resetting and bit line testing transistor being connected to the first upper bit line; a sense amplifier which is connected selectively to one of the first upper bit line and senses and amplifies a cell data appeared on the first upper bit line; and a control circuit which controls to turn one of the first column resetting and bit line testing transistor on to reset an electric potential of the first upper bit line, after data of at least one of the first to fourth nonvolatile memory cells selected by turning at least one of the first to fourth lower column selection transistors on has been sensed by the sense amplifier in an operation time of reading data, and controls to electrically separate the sense amplifier from the first upper bit line while the first to fourth lower column selection transistors and the first column resetting and bit line testing transistor are turned on simultaneously in a bit line test time.

According to a further of the present invention, there is provided a nonvolatile semiconductor memory comprising a memory cell array including a plurality of nonvolatile memory cells arranged in a matrix form, each of the nonvolatile memory cells having a laminated gate in which a floating gate and a control gate are laminated, memory cell array being divided into a plurality of cell blocks in a column direction; first and second lower bit lines which are provided in each of the cell blocks, the first and second lower bit lines being connected correspondingly to first and second nonvolatile memory cells holding data; first and second column selection transistors which are provided in each of the cell blocks, the first and second column selection transistors being connected correspondingly to the first and second lower bit lines; an upper bit line which is provided commonly for the plurality of cell blocks in a column direction, the first and second column selection transistors in the cell blocks being commonly connected to the upper bit line; a column resetting and bit line testing transistor, a drain node of the column resetting and bit line testing transistor being connected to the upper bit line; a sense amplifier which is selectively connected to the upper bit line to sense and amplify data appeared on the upper bit line; and a control circuit which controls to turn on the column resetting and bit line testing transistor connected to one of the upper bit lines to reset an electric potential of the upper bit line, after data of one of the first and second nonvolatile memory cells selected by turning on one of the first and second lower column selection transistors in a selected cell block of the plurality of cell blocks are sensed by the sense amplifier through the one upper bit line which corresponds to the selected cell block in an operation time of reading data, and controls to electrically separate the sense amplifier from the one upper bit line while the first and second lower column selection transistors in the selected cell block of the plurality of cell blocks and the column resetting and bit line testing transistor connected to the upper bit line corresponding to the selected cell block are turned on simultaneously in a bit line test.

According to a further of the present invention, there is provided a nonvolatile semiconductor memory comprising a memory cell array including a plurality of nonvolatile memory cells arranged in a matrix form, each of the nonvolatile memory cells having a laminated gate in which a floating gate and a control gate are laminated, memory cell array being divided into a plurality of cell blocks in a row direction and a column direction; first and second lower bit lines which are provided in each of the cell blocks, the first and second lower bit lines being connected correspondingly to first and second nonvolatile memory cells holding data; first and second column selection transistors which are provided in each of the cell blocks, the first and second column selection transistors being connected correspondingly to the first and second lower bit lines; a plurality of upper bit lines which are provided commonly for the plurality of cell blocks and correspondingly provided for columns, the first and second column selection transistors in those of the cell blocks which are in the same column being commonly connected to a corresponding one of the plurality of upper bit lines; a plurality of column resetting and bit line testing transistors, a drain node of each of the column resetting and bit line testing transistors being connected to a corresponding one of the plurality of upper bit lines; a sense amplifier which is selectively connected to the plurality of upper bit lines to sense and amplify data appeared on the upper bit lines; and a control circuit which controls to turn on the column resetting and bit line testing transistor connected to one of the upper bit lines to reset an electric potential of the upper bit line, after data of one of the first and second nonvolatile memory cells selected by turning on one of the first and second lower column selection transistors in a selected cell block of the plurality of cell blocks are sensed by the sense amplifier through the one upper bit line which corresponds to the selected cell block in an operation time of reading a cell data, and controls to electrically separate the sense amplifier from the one upper bit line while the first and second lower column selection transistors in the selected cell block of the plurality of cell blocks and the column resetting and bit line testing transistor connected to the upper bit line corresponding to the selected cell block are turned on simultaneously in a bit line test.

BRIEF DESCRIPTION OF THE SEVERAL VIEWS OF THE DRAWING

FIG. 5 is a waveform chart showing an example of operation in the bit line test to the memory core portion shown in FIG. 4;

FIG. 12 is a plan view showing a part of a conventional NOR type flash memory in case that a memory core portion has a hierarchical bit line structure;

DETAILED DESCRIPTION OF THE INVENTION

Preferred embodiments of the invention will be described below in detail referring to the accompanying drawings.
(First Embodiment)

Figure 1:
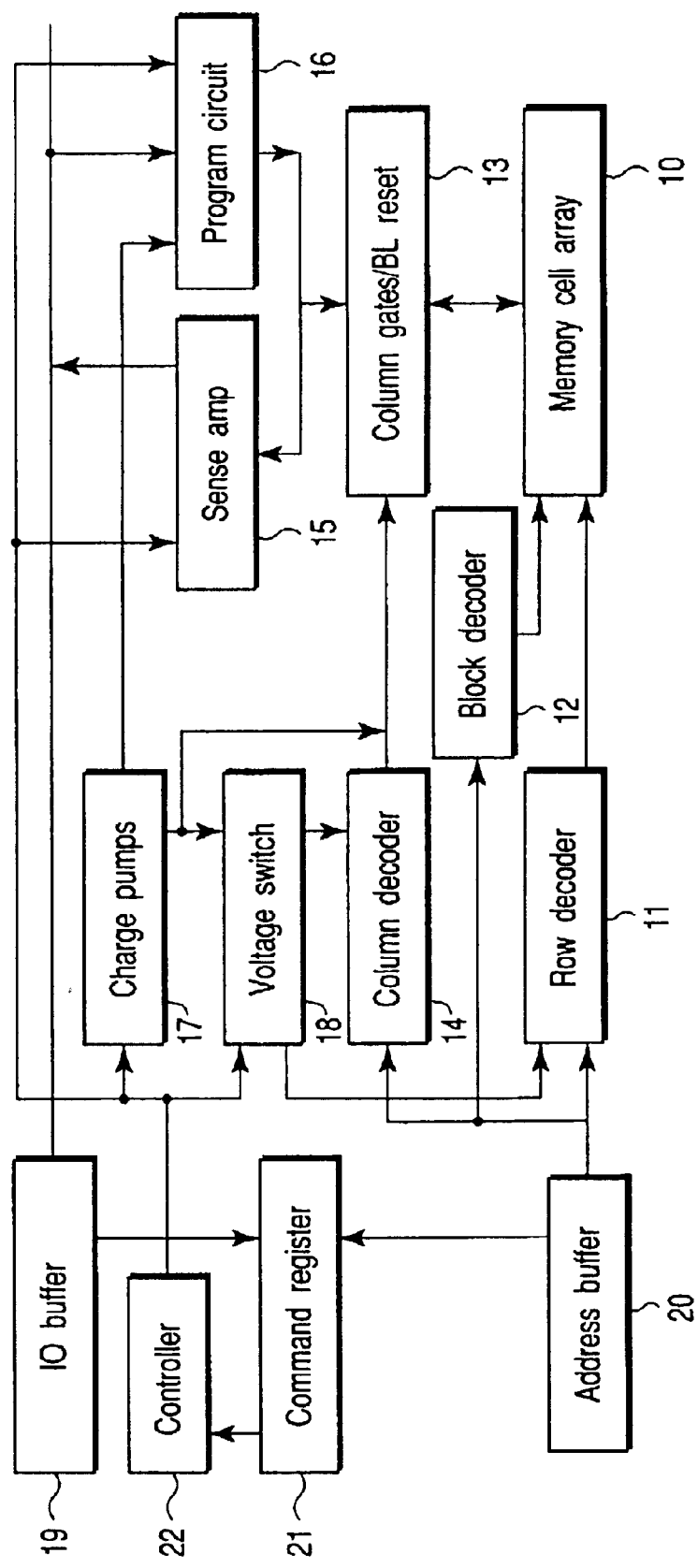
FIG. 1 is a block diagram showing schematically a whole arrangement of a NOR type flash memory according to a first embodiment of the invention.

FIG. 1 is a block diagram showing schematically a whole arrangement of a NOR type flash memory according to a first embodiment of the present invention.

A memory cell array 10 has a hierarchic bit line structure as described later, and cell transistors are arranged in a matrix form in the memory cell array 10.

A row decoder 11 selects a word line of the memory cell array 10, a block decoder 12 selects a block of the memory cell array 10, a column gate/bit line reset circuit 13 performs selecting a bit line and resetting a bit line voltage of the memory cell array 10.

A column decoder 14 controls the column gate/bit line reset 13. A sense amplifier 15 senses and amplifies a voltage of the bit line through the column gate and the data line. Data to be written to the cell transistor are supplied by a program circuit 16 to the bit line through the data line and the column gate.

A charge pump circuit 17 generates various voltages such as a high voltage and an intermediate voltage for writing, a high voltage for erasing, and a high voltage for reading, from a power supply voltage, and the output voltages of the charge pump circuit 17 are supplied to the bit line and a voltage switch circuit 18.

The voltage switch circuit 18 selects and supplies the output voltages of the charge pump circuit 17 to the row decoder 11 and the column decoder 14, as an operating power supply.

A data input/output buffer (IO buffer) 19 controls input of data from external and output of data such as read data from internal. An address buffer 20 amplifies address signal inputted from external and supply the amplified address signal to the row decoder 11, the block decoder 12, and the column decoder 14.

A command register 21 holds temporarily a command inputted from external through the data input/output buffer 19 and an address signal supplied from the address buffer 20. A controller 22 decodes the command supplied from the command resister 21 to generate various control signals.

By using the above-described circuits, the data read, the data write, data re-write, the write verify, read verify, and the erase verify are carried out to the memory cell array 10, and transfer of data such as write data and read data is carried out via the data input/output buffer 19.

Figure 2:
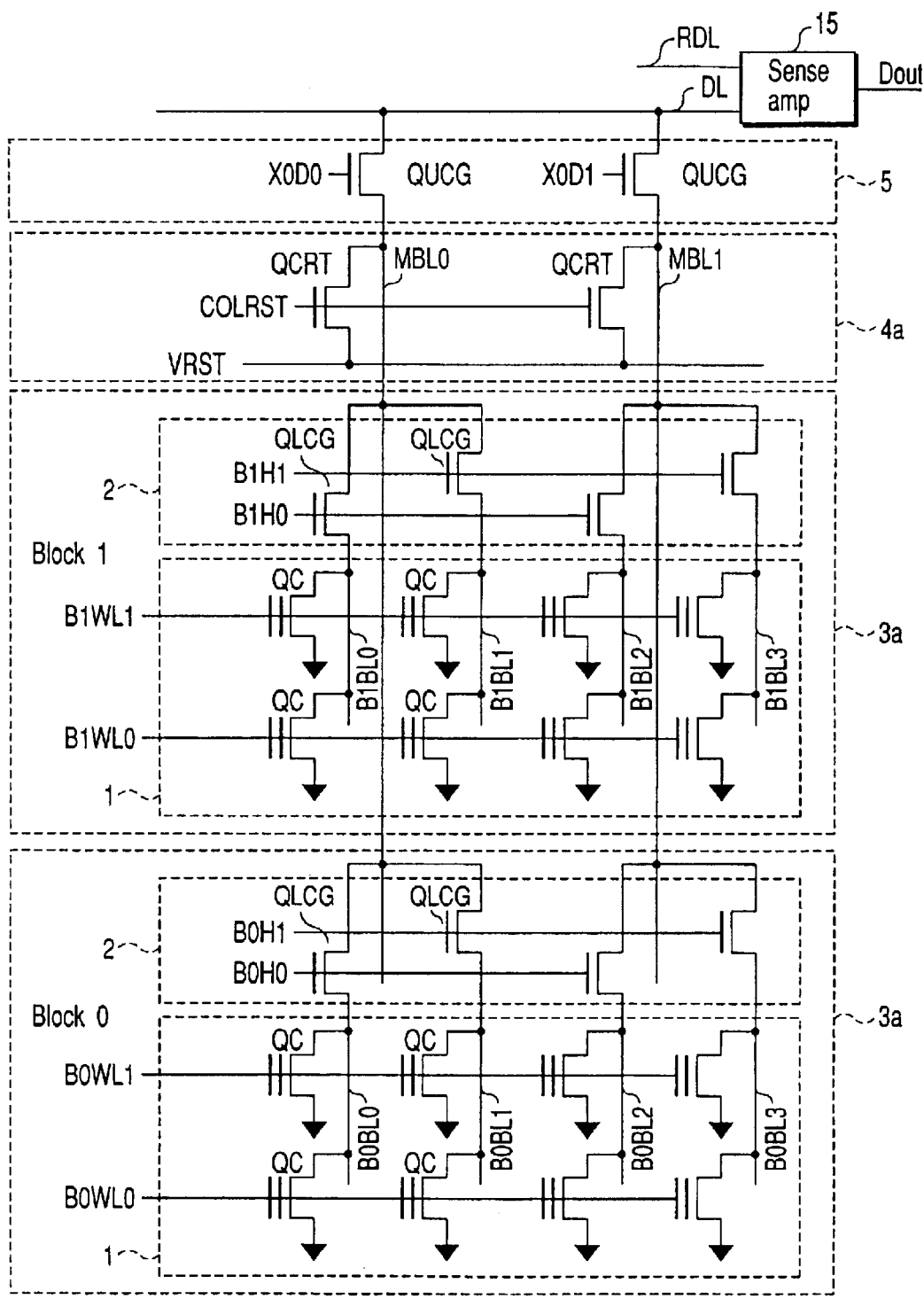
FIG. 2 is an equivalent circuit diagram showing a part of a memory core portion having a hierarchic bit line structure in FIG. 1.

FIG. 2 is an equivalent circuit diagram showing a part of a memory core portion having a hierarchic bit line structure in FIG. 1. The memory core portion has a NOR type memory cell array in which a plurality of nonvolatile memory cells having a laminated gate where the floating gate and the control gate are laminated are arrayed in a matrix form. Compared with the conventional memory core portion shown in FIG. 12, an arrangement of a cell block 3a and a connection between the column reset transistor QCRT and the upper bit lines (main bit line) MBL0, MBL1, ... are changed in FIG. 2. In FIG. 2, the same portions as in FIG. 12 are indicated by the same numerals and characters.

In FIG. 2, reference numeral 1 is a cell transistor area, 2 is a lower column gate area, 3a is a cell block, 4a is a column reset transistor area, and 5 is an upper column gate area.

That is to say, the memory cell array having cell transistor QC arrayed in a matrix form is divided into the plurality of cell blocks 3a in a longitudinal direction (i.e. column direction) of the upper bit lines MBL0, MBL1, . . . . The upper bit lines MBL0, MBL1, ... are common for the plurality of cell blocks 3a.

Operation such as the read and the write is carried out while selecting one of the plurality of cell blocks 3a, and the bit line test operation is carried out while selecting optional numbers of the cell blocks 3a.

In each cell block 3a, a plurality of lower bit lines BiBL0, BiBL1, BiBL2, BiBL3, ... (i=0, 1, ...) are provided to extend in the column direction of the memory cell array. Drains of a plurality of cell transistors QC are connected to a corresponding one of the lower bit lines BiBL0, BiBL1, BiBL2, BiBL3, . . . . Also in each cell block 3a, a plurality of word lines BiWL0, BiWL1, BiBL2, ... (i=0, 1, ... ) are provided to extend in a row direction of the memory cell array. Control gates of a plurality of cell transistors QC are connected to a corresponding one of the word lines BiWL0, BiWL1, BiBL2, . . . . Adjacent two lower bit lines (BiBL0, BiBL1), (BiBL2, BiBL3), ... of the lower bit lines BiBL0, BiBL1, BiBL2, BiBL3, ... form one pair. The adjacent two lower bit lines (BiBL0, BiBL1), (BiBL2, BiBL3), ... are commonly connected to a corresponding one of the upper bit lines MLB0, MLB1, ... through respective column selection transistors (lower column gates) QLCG. Each of the column selection transistors QLCG is controlled by a signal of a corresponding one of column selection lines BiH0, BiH1, ... (i=0, 1, ... ). The lower bit lines BiBL0, BiBL1, BiBL2, BiBL3, ... comprise metal wirings of a first-stage layer and the upper bit lines MBL0, MBL1, ... comprise metal wirings of a second-stage layer.

Figure 15:
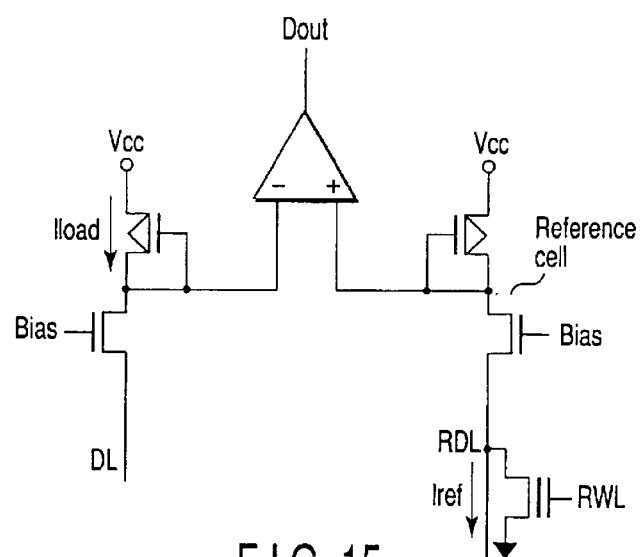
FIG. 15 is an example of a circuit diagram of a sense amplifier 15 of the memory shown in FIG. 12.

Each of the upper bit lines MBL0, MBL1, ... comprise is connected to a data line DL and a sense amplifier 15 through a corresponding one of upper bit line selection transistors (upper column gates) QUCG. Upper column selection lines XiD0, XiD1, ... (i=0, 1, ... ) are connected to the gates of the respective upper bit line selection transistors QUCG. The sense amplifier as shown in FIG. 15 may be used as the sense amplifier 15 of the memory device shown in FIG. 2.

Furthermore, each of the upper bit lines MBL0, MBL1, ... is connected to the drain of a corresponding one of column reset transistors QCRT. The source of each of the column reset transistors QCRT is connected to a reset voltage line VRST, and the gate of each of the column reset transistors QCRT is connected to a column reset signal line COLRST.

In the embodiment, the column reset transistors QCRT connected to the upper bit lines MBL0, MBL1, . . . are provided between the arrangement of the cell blocks 3a and the arrangement of the upper column gates QUCG.

As described later, the column reset transistor QCRT functions to reset charges of bit lines after read operation and also apply a stress voltage to the drain of the cell transistor through bit lines in the drain stress test (bit line test), so that the column reset transistor QCRT is a column-resetting and bit line testing transistor.

In the arrangement of FIG. 2, compared with the conventional arrangement described above referring to FIG. 12, the column reset transistor area 4a is commonly provided for the plurality of cell blocks 3a. That is to say, the column reset transistor area 4a is commonly provided for the plurality of cell blocks 3a through which the upper bit lines MBL0, MBL1, ... extend.

Figure 3A:
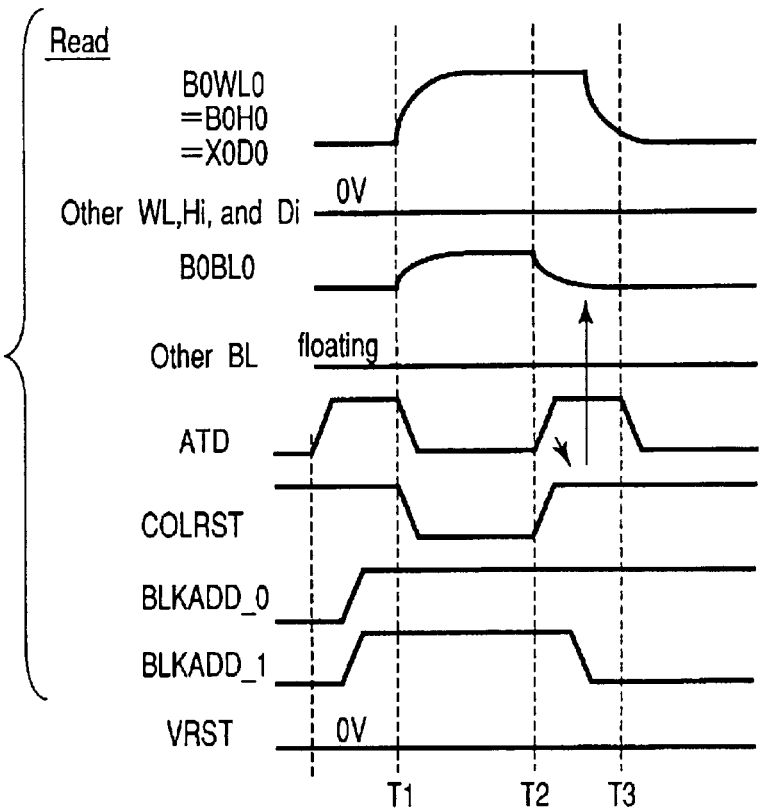
FIG. 3A is a waveform chart showing an example of read operation (Read) to the memory core portion shown in FIG. 2.

FIG. 3A is waveform charts showing an example of the read operation to the memory core portion shown in FIG. 2.

When, for example, the word line B0WL0 is selected and the column line B0H0 is activated ("H" level) to select a lower column gate QLCG, a corresponding cell transistor in the cell block 3a of a block number 0 is selected. A voltage dependent on data of the selected cell transistor is appeared on the upper bit line MBL0 through the lower bit line B0BL0. At this time, in case that a column gate selection line X0D0 is the "H" level and thus the upper bit line MBL0 is electrically connected to a data line DL, the sense amplifier 15 senses and amplifies a voltage of the data line DL to output a cell data.

When the read operation is ended, the column reset signal line COLRST is activated ("H" level) while the selected lower column gate QLCG is kept at on-state, so that the charge of the upper bit line MBL0 is discharged through the column resetting transistor QCRT. Since at this time the column reset voltage line VRST of the source of the column reset transistor QCRT is set at 0V, an electric potential of the upper bit line MBL0 is reset to 0V.

Figure 3B:
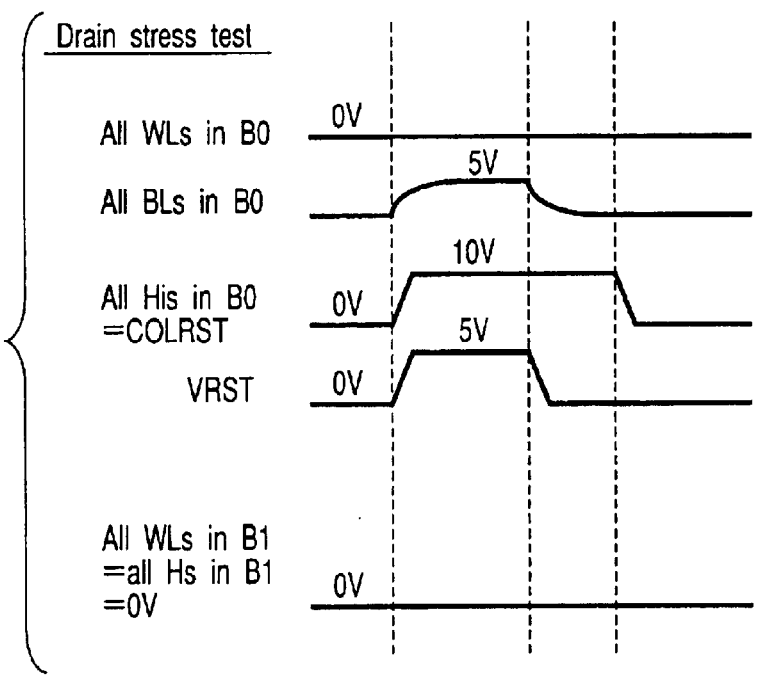
FIG. 3B is a waveform chart showing an example of operation in a bit line test (drain stress test) to the memory core portion shown in FIG. 2.

FIG. 3B is waveform charts showing an example of operation in the drain stress test (bit line test) to the memory core portion shown in FIG. 2.

In a state that all of the cell transistors in the one or plurality of cell blocks 3a as a target of the test are set at "0" data beforehand, all of the lower column gates QLCG in the selected cell block 3a are turned on and all the upper column gates QUCG are turned off.

In this case, the column reset voltage line VRST is set at, for example, a voltage of 5V in writing, the voltage of 5V is applied simultaneously as the stress voltage from the source of the column reset transistor QCRT to the drains of all of the cell transistors in the selected cell block 3a so that a test time is shortened.

Since a gate width of the column reset transistor QCRT is sufficiently small, even though there is a defective leak column in the selected cell block 3a, electric potential of other upper bit lines is not almost affected by the defective leak column.

In the lower bit lines in the cell blocks which are in a non-selected state, since the corresponding lower column gates are turned off, the stress voltage is not applied to the drains of the cell transistors of the non-selected state cell blocks.

As described above, in a state that the stress voltage is applied to the drains of the cell transistors in the one or plurality of cell blocks 3a as a target of the drain stress test while these cell transistors are set at "0" data, the threshold voltage after the test of those of the cell transistors which have a defect in the drain side tunnel oxide film portion is lowered. A yield can be increased by performing a redundancy relief for the defective cell transistors.

In the present embodiment, since only one column reset transistor area 4a is provided for the plurality of cell blocks 3a, even when it is difficult that the peripheral transistors are scaled down while the cell transistors can be scaled down, it is unnecessary to enlarge the column reset transistor area 4a, thus enabling a high integration to be relatively easy.

The operations of FIG. 3A and FIG. 3B are controlled by the controller shown in FIG. 1.

(Second Embodiment)

Figure 4:
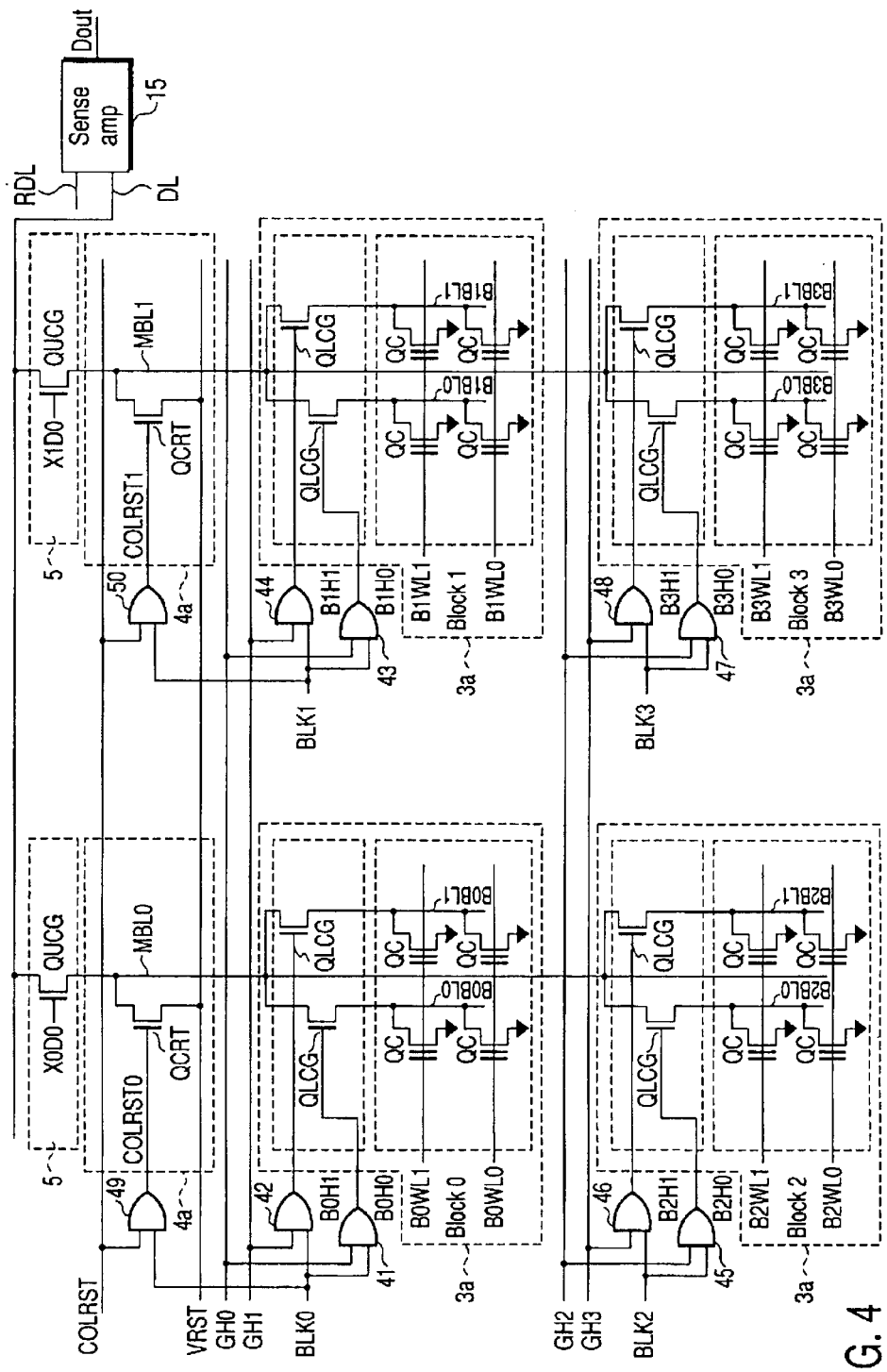
FIG. 4 is an equivalent circuit diagram showing a part of a structure of a memory core portion in a NOR type flash memory according to a second embodiment of the invention.

FIG. 4 is an equivalent circuit diagram showing a part of a structure of a memory core portion in a NOR type flash memory according to a second embodiment of the present invention.

Compared with the memory core portion shown in FIG. 2, in the memory core portion of the second embodiment, the memory cell array is divided into the plurality of cell blocks 3a in both directions of the row direction (word line direction) and the column direction (bit line direction). The column reset transistor area 4a is divided in correspondence to the rows of the memory cell array, and the respective column reset transistor areas 4a can be selected independently from each other.

With the arrangement, in the bit line test operation, the selection of each of the cell blocks 3a with the selection of each of the column reset transistors in the column reset transistor area 4a is optionally correlated to one other. In FIG. 4, the same portions as in FIG. 2 are indicated by the same numerals and characters as in FIG. 2.

In the cell block of the block number 0, in order to generate signals of the lower column gate selection lines B0H0 and B0H1 which select alternatively the two adjacent lower columns sharing the upper bit line MBL0, a logical product of a signal of a global column gate selection line GH0 and a signal of a cell block selection line BLK0 is attained by a two-input AND circuit 41 and also a logical product of a signal of a global column gate selection line GH1 and a signal of a cell block selection line BLK0 is attained by a two-input AND circuit 42.

In the cell block of the block number 1 which is in the same row as the cell block of the block number 0, in order to generate signals of the lower column gate selection lines B1H0 and B1H1 which select alternatively the two adjacent lower columns sharing the upper bit line MBL1, a logical product of a signal of a global column gate selection line GH0 and a signal of a cell block selection line BLK1 is attained by a two-input AND circuit 43 and also a logical product of a signal of a global column gate selection line GH1 and a signal of a cell block selection line BLK1 is attained by a two-input AND circuit 44.

In the cell block of the block number 2 which is in the column as the cell block of the block number 0, in order to generate signals of the lower column gate selection lines B2H0 and B2H1 which select alternatively the two adjacent lower columns sharing the upper bit line MBL0, a logical product of a signal of a global column gate selection line GH2 and a signal of a cell block selection line BLK2 is attained by a two-input AND circuit 45 and also a logical product of a signal of a global column gate selection line GH3 and a signal of a cell block selection line BLK2 is attained by a two-input AND circuit 46.

In the cell block of the block number 3 which is in the same row as the cell block of the block number 2 and in the same column as the cell block of the block number 1, in order to generate signals of the lower column gate selection lines B3H0 and B3H1 which select alternatively the two adjacent lower columns sharing the upper bit line MBL1, a logical product of a signal of a global column gate selection line GH2 and a signal of a cell block selection line BLK3 is attained by a two-input AND circuit 47 and also a logical product of a signal of a global column gate selection line GH3 and a signal of a cell block selection line BLK3 is attained by a two-input AND circuit 48.

The column reset transistor QCRT connected to the upper bit line MBL0 is controlled by a column reset signal COLRST0 which is a logical product attained by a two-input AND circuit 49, of a signal of the column reset signal line COLRST and a signal of a cell block selection line BLK0.

The column reset transistor QCRT connected to the upper bit line MBL1 is controlled by a column reset signal COLRST1 which is a logical product attained by a two-input AND circuit 50, of a signal of the column reset signal line COLRST and a signal of a cell block selection line BLK1.

FIG. 5 is a waveform chart showing an example of operation in the bit line test (drain stress test) to the memory core portion shown in FIG. 4.

In an operation of the bit line test shown in FIG. 5, the column reset voltage line VRST is set at a 5V of a bit line bias voltage, and the signal of the column reset signal line COLRST is in an activated state. In this state, the plurality of cell blocks are selected successively one by one by assigning one of the global column selection lines GH0 to GH3 and one of the block selection lines BLK0 to BLK3. All of the lower bit lines BiBL in the selected cell block are selected simultaneously, the test is carried out by applying a bit line bias through the upper bit line MBL corresponding to the selected cell block to all of the cell transistors QC in the selected cell block. This allows the test time to be further shorter than in the bit line test shown in FIG. 3B. The test for the cell transistors of other cell blocks, that is, of the non-selected cell blocks can not be carried out while the test in the selected cell block is carried out.

The sense amplifier as shown in FIG. 15 may be used as the sense amplifier 15 of the memory device shown in FIG. 4. The operation of FIG. 5 is controlled by the controller shown in FIG. 1.

Figure 6:
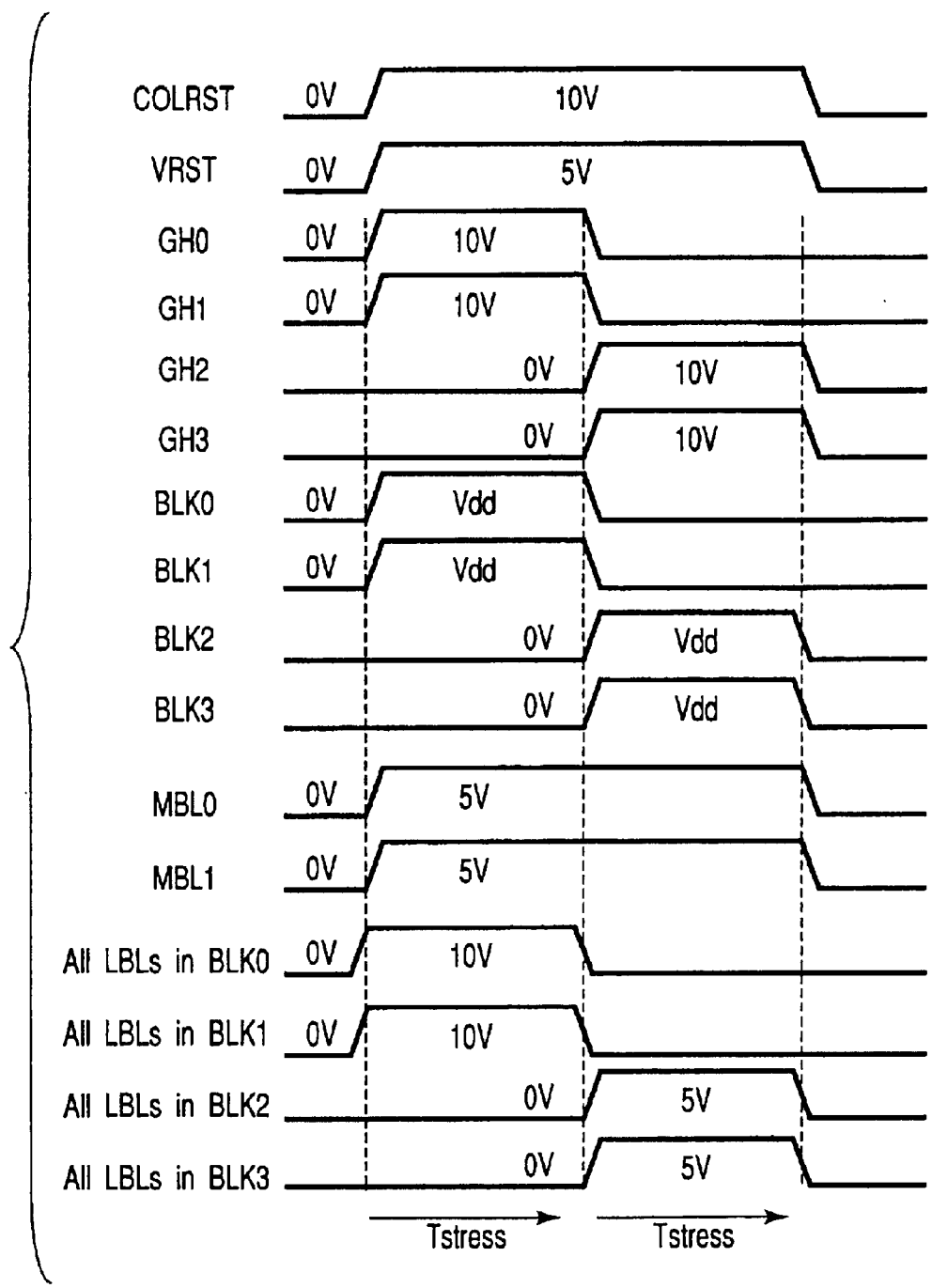
FIG. 6 is a waveform chart showing another example of operation in the bit line test to the memory core portion shown in FIG. 4.

FIG. 6 is a waveform chart showing another example of operation in the bit line test to the memory core portion shown in FIG. 4.

In an operation of the bit line test shown in FIG. 6, the column reset voltage line VRST is set at a 5V of a bit line bias voltage, and the signal of the column reset signal line COLRST is in an activated state. In this state, the plurality of cell blocks are selected successively in unit of row by assigning two of the global column selection lines GH0 to GH3 and two of the block selection lines BLK0 to BLK3. All of the lower bit lines BiBL in the cell blocks selected in unit of row are selected simultaneously, the test is carried out by applying a bit line bias through the upper bit lines MBL corresponding to the cell blocks selected in unit of row to all of the cell transistors QC in the selected cell block of unit of row. This allows the test time to be further shorter than in the bit line test shown in FIG. 5. The test for the cell transistors of other cell blocks, that is, of the non-selected cell blocks can not be carried out while the test for the selected cell blocks is carried out.

The operation of FIG. 6 is controlled by the controller shown in FIG. 1.

Figure 7:
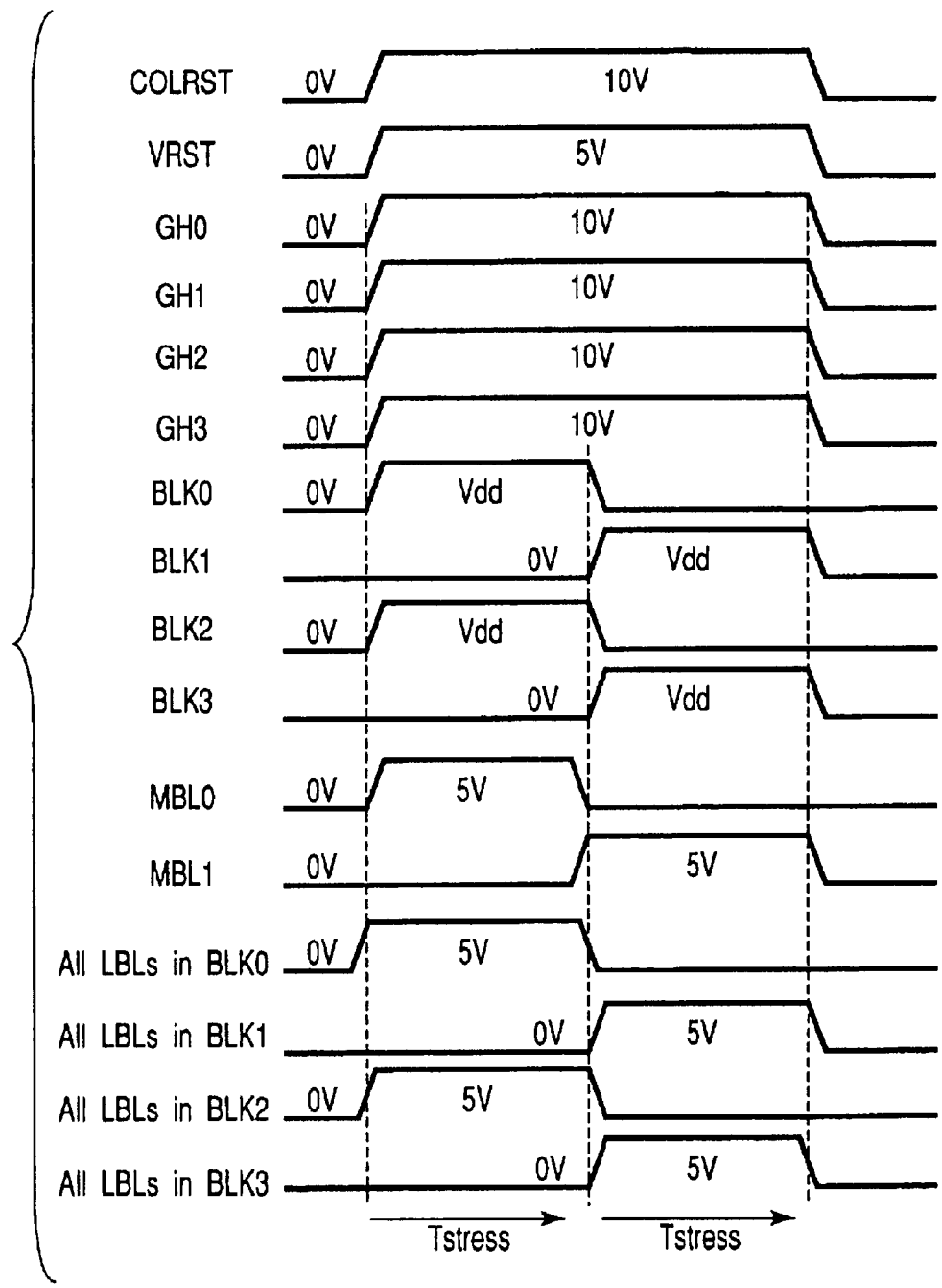
FIG. 7 is a waveform chart showing still another example of operation in the bit line test to the memory core portion shown in FIG. 4.

FIG. 7 is a waveform chart showing a further example of operation in the bit line test to the memory core portion shown in FIG. 4.

In an operation of the bit line test shown in FIG. 6, the column reset voltage line VRST is set at a 5V of a bit line bias voltage, and the signal of the column reset signal line COLRST is in an activated state. In this state, the plurality of cell blocks are selected successively in unit of column (in this example, in unit of upper bit line MBL0 or MBL1) by assigning all the four global column selection lines GH0 to GH3 and two of the block selection lines BLK0 to BLK3. All of the lower bit lines BiBL in the cell blocks selected in unit of column are selected simultaneously, the test is carried out by applying a bit line bias through the upper bit line MBL corresponding to the cell blocks selected in unit of column to all of the cell transistors QC in the selected cell block of unit of column. This allows the test time to be further shorter than in the bit line test shown in FIG. 5. The test for the cell transistors of other cell blocks, that is, of the non-selected cell blocks can not be carried out while the test for the selected cell blocks is carried out.

For example, the two block selection lines are the block selection lines BLK0 and BLK2 or BLK1 and BLK3.

Figure 8:
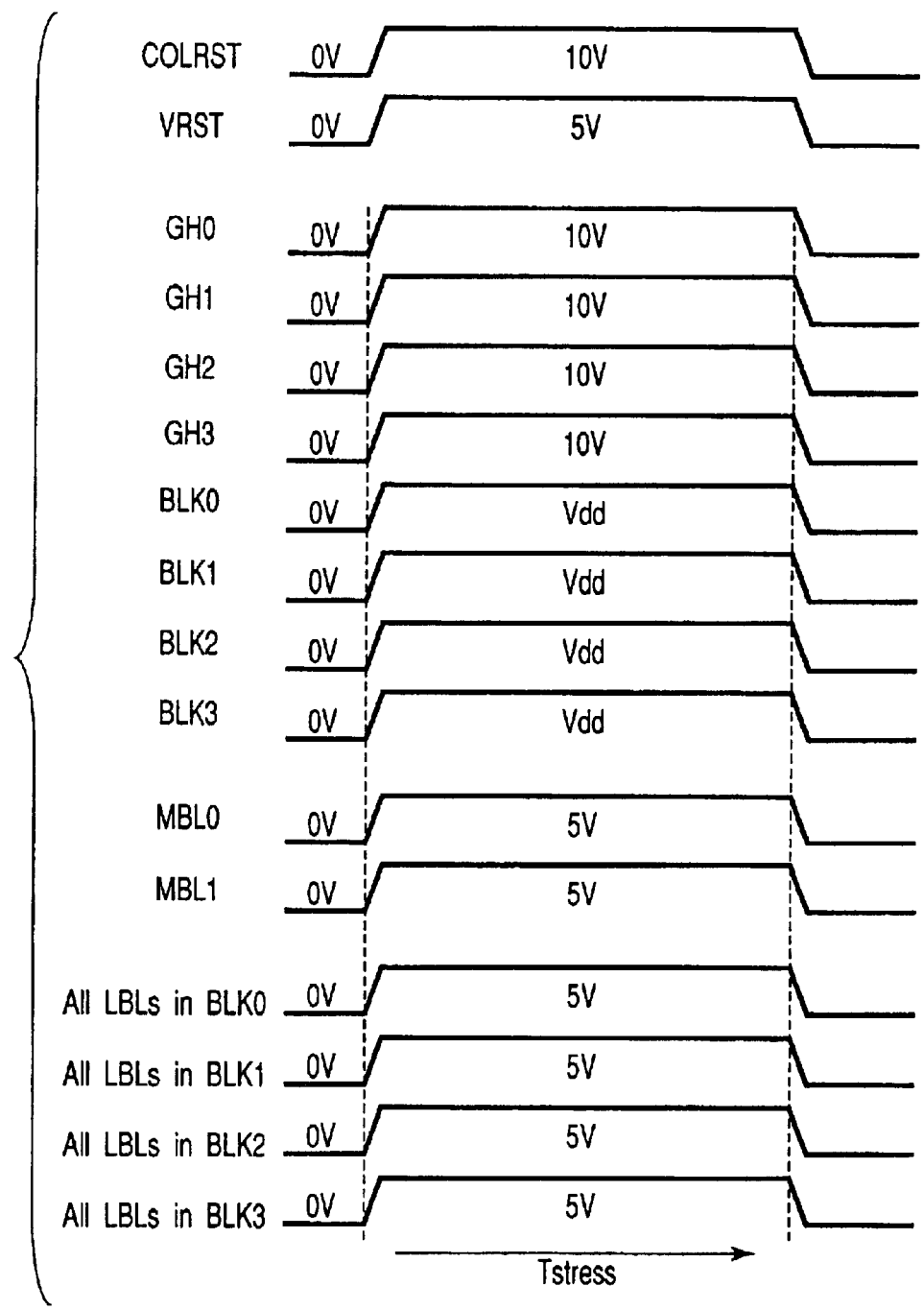
FIG. 8 is a waveform chart showing still another example of operation in the bit line test to the memory core portion shown in FIG. 4.
Figure 9:
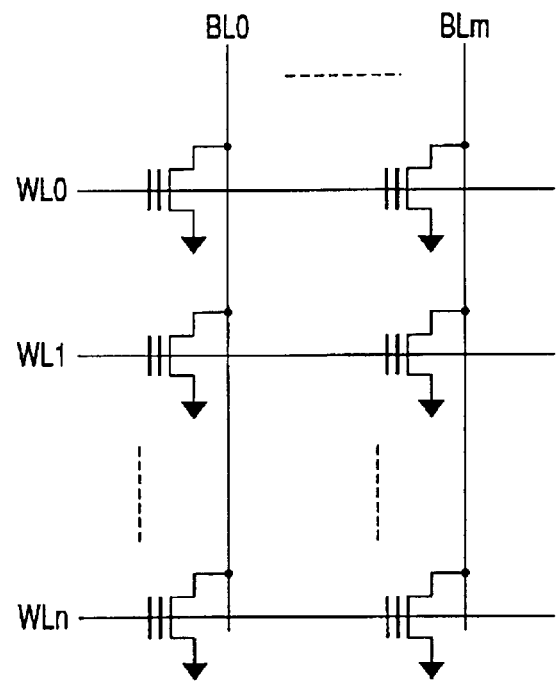
FIG. 9 is an equivalent circuit diagram showing a part of a memory cell array in a NOR type flash memory.
Figure 10:
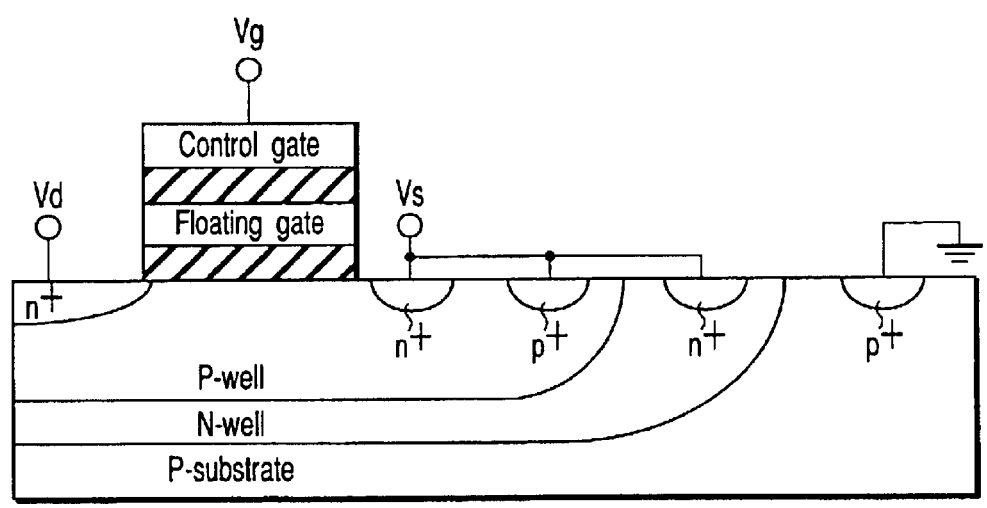
FIG. 10 is a sectional view of a cell transistor shown in FIG. 9.
Figure 11:
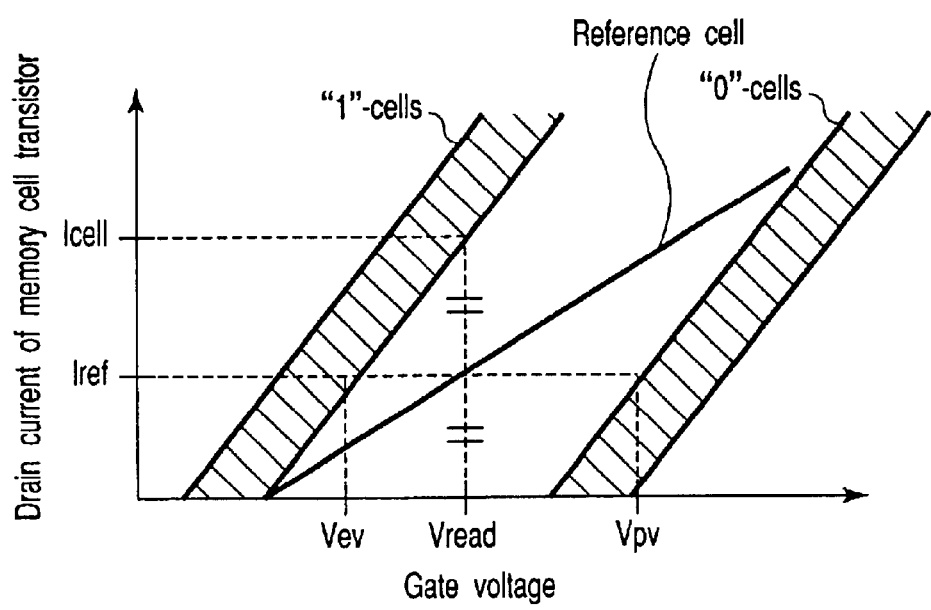
FIG. 11 is a characteristic view showing a relationship between a control gate voltage and a drain current of the cell transistor shown in FIG. 10.
Figure 13A:
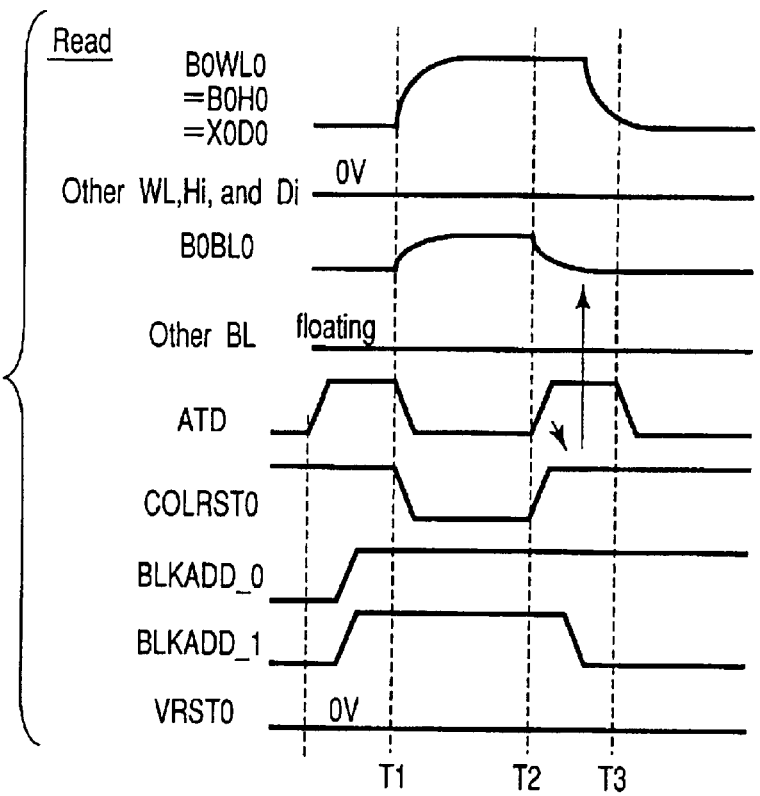
FIG. 13A is a waveform chart showing an example of read operation (Read) to the memory core portion shown in FIG. 12.
Figure 13B:
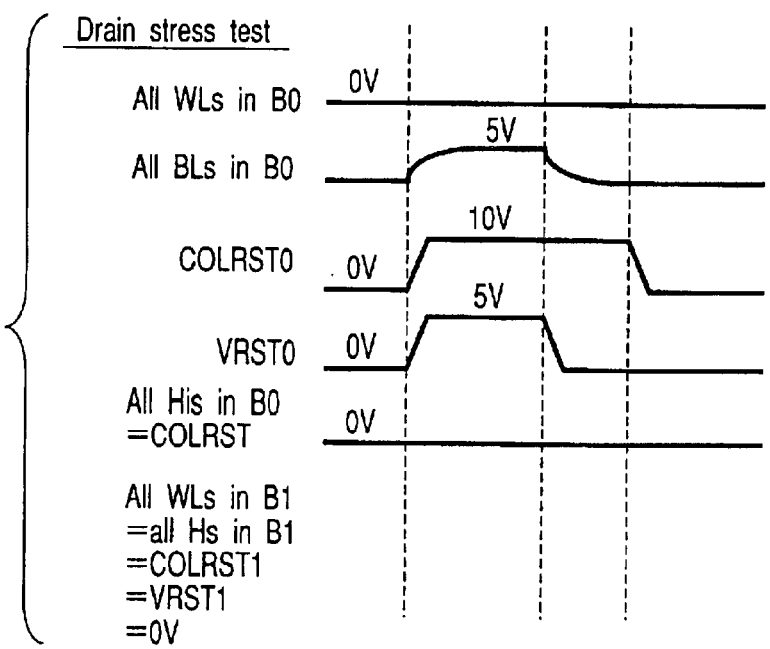
FIG. 13B is a waveform chart showing an example of operation in a bit line test (drain stress test) to the memory core portion shown in FIG. 12.
Figure 13C:
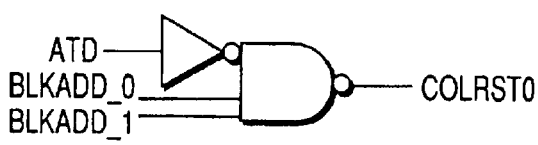
FIG. 13C is an example of a circuit diagram for generating a bit line reset signal COLRST0.
Figure 14:
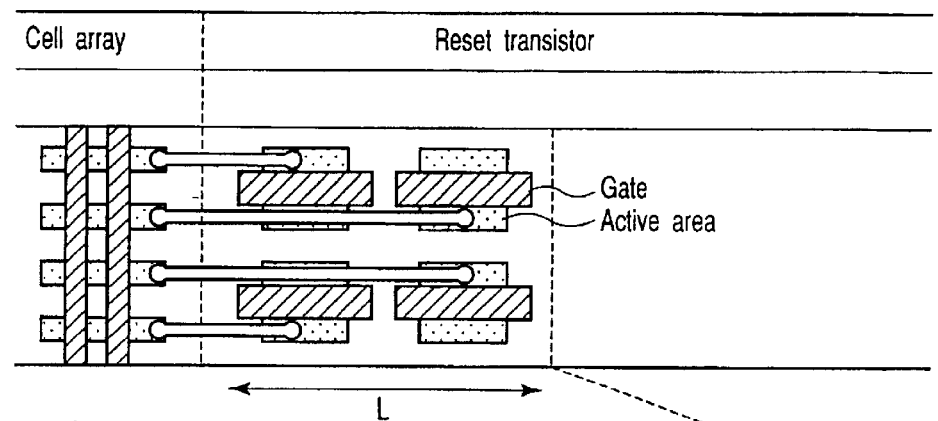
FIG. 14 is a pattern view showing before-scaling and after-scaling arrangements of cell transistors in a cell array area (Cell array) and column reset transistors in a column reset transistor area (Reset transistor) in the memory core portion shown in FIG. 12.
Figure 14:
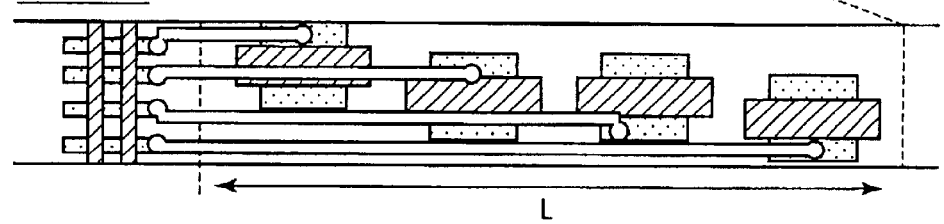

FIG. 8 is a waveform chart showing a further example of operation in the bit line test to the memory core portion shown in FIG. 4.

In an operation of the bit line test shown in FIG. 8, the column reset voltage line VRST is set at a 5V of a bit line bias voltage, and the signal of the column reset signal line COLRST is in an activated state. In this state, the plurality of the cell blocks are simultaneously selected by assigning the global column selection lines GH0 to GH3 and the block selection lines BLK0 to BLK3. All of the lower bit lines BiBL in the selected cell blocks are selected simultaneously, the test is carried out by applying a bit line bias through the upper bit lines MBL corresponding to the selected cell blocks to all of the cell transistors QC in the selected cell block. This allows the test time to be further shorter than in the bit line test shown in FIG. 6 or 7.

The operation of FIG. 8 is controlled by the controller shown in FIG. 1.

Actually, among the above-described various test modes, a test sequence is selected such that the test time is shortened as much as possible within the range which a total leak current does not exceed a supply capacity of a stress voltage generating circuit (not shown).

As described above, according to a nonvolatile semiconductor memory of the present invention, even when the scaling of the peripheral transistors is difficult, a highly integrated nonvolatile memory can be realized.

Furthermore, in the bit line test, the selection of the respective cell blocks are correlated to the selection of the respective column reset transistor areas, and thus the time of the test operation can be shortened.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
    a first nonvolatile memory cell and a second nonvolatile memory cell, each of the nonvolatile memory cells holding data;
    first and second bit lines which are connected correspondingly to the first and second nonvolatile memory cells;
    first and second column selection transistors connected correspondingly to the first and second bit lines;
    a first column resetting and bit line testing transistor a drain of which is connected to a first node to which the first and second column selection transistors are commonly connected;
    a sense amplifier which is selectively connected to the first node and senses and amplifies a cell data appeared on the first node; and
    a control circuit which controls to turn the first column resetting and bit line testing transistor on to reset an electric potential of the first node, after data of one of the first and second nonvolatile memory cells selected by turning one of the first and second column selection transistors on has been sensed by the sense amplifier in a first time duration, and controls to electrically separate the sense amplifier from the first node while the first and second column selection transistors and the first column resetting and bit line testing transistor are turned on simultaneously in a second time duration.

2. A nonvolatile semiconductor memory according to claim 1, further comprising a third bit line and a data line which is connected to the third bit line via a third column selection transistor, and in which the sense amplifier is connected to the data line.

3. A nonvolatile semiconductor memory according to claim 1, in which a ground potential is applied to a source of the first column resetting and bit line testing transistor in the first time duration.

4. A nonvolatile semiconductor memory according to claim 2, in which a ground potential is applied to a source of the first column resetting and bit line testing transistor in the first time duration.

5. A nonvolatile semiconductor memory according to claim 1, in which a ground potential is applied to a source of the first column resetting and bit line testing transistor in the second time duration.

6. A nonvolatile semiconductor memory according to claim 2, in which a ground potential is applied to a source of the first column resetting and bit line testing transistor in the second time duration.

7. A nonvolatile semiconductor memory according to claim 3, in which a ground potential is applied to a source of the first column resetting and bit line testing transistor in the second time duration.

8. A nonvolatile semiconductor memory according to claim 4, in which a ground potential is applied to a source of the first column resetting and bit line testing transistor in the second time duration.

9. A nonvolatile semiconductor memory according to claim 5, in which the positive voltage is equal to a write voltage which is applied to the first node in writing data to the nonvolatile memory cells.

10. A nonvolatile semiconductor memory according to claim 6, in which the positive voltage is equal to a write voltage which is applied to the first node in writing data to the nonvolatile memory cells.

11. A nonvolatile semiconductor memory according to claim 7, in which the positive voltage is equal to a write voltage which is applied to the first node in writing data to the nonvolatile memory cells.

12. A nonvolatile semiconductor memory according to claim 8, in which the positive voltage is equal to a write voltage which is applied to the first node in writing data to the nonvolatile memory cells.

13. A nonvolatile semiconductor memory comprising:
a first nonvolatile memory cell and a second nonvolatile memory cell a source of each of which is connected to a first common node, each of the first and second nonvolatile memory cells holding data;
a third nonvolatile memory cell and a fourth nonvolatile memory cell a source of each of which is connected to a second common node, each of the third and fourth nonvolatile memory cells holding data;
first to fourth lower bit lines which are connected correspondingly to the first to fourth nonvolatile memory cells;
first to fourth lower column selection transistors one ends of which are connected correspondingly to the first to fourth lower bit lines;
a first upper bit line which is connected in common to the other end of each of the first and second lower column selection transistors;
a second upper bit line which is connected in common to the other end of each of the third and fourth lower column selection transistors;
first and second column resetting and bit line testing transistors, drains of the first and second column resetting and bit line testing transistors being connected corresponding to the first and second upper bit lines;
a sense amplifier which is connected selectively to one of the first and second upper bit lines and senses and amplifies a cell data appeared on one of the first and second upper bit lines; and
a control circuit which controls to turn one of the first and the second column resetting and bit line testing transistors on to reset an electric potential of one of the first and the second upper bit lines, after data of at least one of the first to fourth nonvolatile memory cells selected by turning at least one of the first to fourth lower column selection transistors on has been sensed by the sense amplifier in an operation time of reading cell data, and controls to electrically separate the sense amplifier from the first and second upper bit lines while the first to fourth lower column selection transistors and the first and second column resetting and bit line testing transistors are turned on simultaneously in a bit line test time.

14. A nonvolatile semiconductor memory according to claim 13, in which, a positive voltage is applied to a source of the column resetting and bit line testing transistor which is turned on, of the first and second column resetting and bit line testing transistors in the bit line test time.

15. A nonvolatile semiconductor memory according to claim 14, in which the positive voltage is equal to a write voltage which is applied to the upper bit lines in writing data to the nonvolatile memory cells.

16. A nonvolatile semiconductor memory comprising:
a first nonvolatile memory cell and a second nonvolatile memory cell a source of each of which is connected to a first common node, each of the first and second nonvolatile memory cells holding data;
a third nonvolatile memory cell and a fourth nonvolatile memory cell a source of each of which is connected to a second common node, each of the third and fourth nonvolatile memory cells holding data;
first to fourth lower bit lines which are connected correspondingly to the first to fourth nonvolatile memory cells;
first to fourth lower column selection transistors one ends of which are connected correspondingly to the first to fourth lower bit lines;
a first upper bit line which is connected to the other ends of the first to fourth lower column selection transistors;
first column resetting and bit line testing transistor, a drain of the first column resetting and bit line testing transistor being connected to the first upper bit line;
a sense amplifier which is connected selectively to one of the first upper bit line and senses and amplifies a cell data appeared on the first upper bit line; and
a control circuit which controls to turn one of the first column resetting and bit line testing transistor on to reset an electric potential of the first upper bit line, after data of at least one of the first to fourth nonvolatile memory cells selected by turning at least one of the first to fourth lower column selection transistors on has been sensed by the sense amplifier in an operation time of reading data, and controls to electrically separate the sense amplifier from the first upper bit line while the first to fourth lower column selection transistors and the first column resetting and bit line testing transistor are turned on simultaneously in a bit line test time.

17. A nonvolatile semiconductor memory according to claim 16, in which, a positive voltage is applied to a source of the first column resetting and bit line testing transistor in the bit line test time.

18. A nonvolatile semiconductor memory according to claim 17, in which the positive voltage is equal to a write voltage which is applied to the upper bit lines in writing data to the nonvolatile memory cells.

19. A nonvolatile semiconductor memory according to claim 1, in which each of said nonvolatile memory cells comprises a laminated gate in which a floating gate and a control gate are laminated to each other, and the nonvolatile memory cells are connected in a scheme of a memory cell array,
the memory cell array is divided into a plurality of memory cell blocks in a longitudinal direction of the bit lines, and
the column resetting and bit line testing transistor is arranged in an area at one side of the memory cell array.

20. A nonvolatile semiconductor memory according to claim 13, in which each of said nonvolatile memory cells comprises a laminated gate in which a floating gate and a control gate are laminated to each other, and the nonvolatile memory cells are connected in a scheme of a memory cell array,
the memory cell array is divided into a plurality of memory cell blocks in a longitudinal direction of the bit lines, and
the column resetting and bit line testing transistor is arranged in an area at one side of the memory cell array.

21. A nonvolatile semiconductor memory according to claim 16, in which each of said nonvolatile memory cells comprises a laminated gate in which a floating gate and a control gate are laminated to each other, and the nonvolatile memory cells are connected in a scheme of a memory cell array, the memory cell array is divided into a plurality of memory cell blocks in a longitudinal direction of the bit lines, and the column resetting and bit line testing transistor is arranged in an area at one side of the memory cell array.

22. A nonvolatile semiconductor memory comprising:

a memory cell array including a plurality of nonvolatile memory cells arranged in a matrix form, each of the nonvolatile memory cells having a laminated gate in which a floating gate and a control gate are laminated, memory cell array being divided into a plurality of cell blocks in a column direction;

first and second lower bit lines which are provided in each of said cell blocks, the first and second lower bit lines being connected correspondingly to first and second nonvolatile memory cells holding data;

first and second column selection transistors which are provided in each of said cell blocks, the first and second column selection transistors being connected correspondingly to the first and second lower bit lines;

an upper bit line which is provided commonly for the plurality of cell blocks in a column direction, the first and second column selection transistors in the cell blocks being commonly connected to the upper bit line;

a column resetting and bit line testing transistor, a drain node of the column resetting and bit line testing transistor being connected to the upper bit line;

a sense amplifier which is selectively connected to the upper bit line to sense and amplify data appeared on the upper bit line; and a control circuit which controls to turn on the column resetting and bit line testing transistor connected to one of the upper bit lines to reset an electric potential of the upper bit line, after data of one of the first and second nonvolatile memory cells selected by turning on one of the first and second lower column selection transistors in a selected cell block of the plurality of cell blocks are sensed by the sense amplifier through said one upper bit line which corresponds to the selected cell block in an operation time of reading data, and controls to electrically separate the sense amplifier from said one upper bit line while the first and second lower column selection transistors in the selected cell block of said plurality of cell blocks and the column resetting and bit line testing transistor connected to the upper bit line corresponding to the selected cell block are turned on simultaneously in a bit line test.

23. A nonvolatile semiconductor memory comprising:

a memory cell array including a plurality of nonvolatile memory cells arranged in a matrix form, each of the nonvolatile memory cells having a laminated gate in which a floating gate and a control gate are laminated, memory cell array being divided into a plurality of cell blocks in a row direction and a column direction;

first and second lower bit lines which are provided in each of said cell blocks, the first and second lower bit lines being connected correspondingly to first and second nonvolatile memory cells holding data;

first and second column selection transistors which are provided in each of said cell blocks, the first and second column selection transistors being connected correspondingly to the first and second lower bit lines;

a plurality of upper bit lines which are provided commonly for the plurality of cell blocks and correspondingly provided for columns, the first and second column selection transistors in those of the cell blocks which are in the same column being commonly connected to a corresponding one of the plurality of upper bit lines;

a plurality of column resetting and bit line testing transistors, a drain node of each of the column resetting and bit line testing transistors being connected to a corresponding one of the plurality of upper bit lines;

a sense amplifier which is selectively connected to the plurality of upper bit lines to sense and amplify data appeared on the upper bit lines; and a control circuit which controls to turn on the column resetting and bit line testing transistor connected to one of the upper bit lines to reset an electric potential of the upper bit line, after data of one of the first and second nonvolatile memory cells selected by turning on one of the first and second lower column selection transistors in a selected cell block of the plurality of cell blocks are sensed by the sense amplifier through said one upper bit line which corresponds to the selected cell block in an operation time of reading a cell data, and controls to electrically separate the sense amplifier from said one upper bit line while the first and second lower column selection transistors in the selected cell block of said plurality of cell blocks and the column resetting and bit line testing transistor connected to the upper bit line corresponding to the selected cell block are turned on simultaneously in a bit line test.

* * * * *